(12) United States Patent
Felici

(10) Patent No.: US 12,085,588 B2
(45) Date of Patent: Sep. 10, 2024

(54) VERTICAL PROBE HEAD WITH IMPROVED CONTACT PROPERTIES TOWARDS A DEVICE UNDER TEST

(71) Applicant: Technoprobe S.p.A., Cernusco Lombardone (IT)

(72) Inventor: Stefano Felici, San Jose, CA (US)

(73) Assignee: Technoprobe S.p.A., Cernusco Lombardone (IT)

( * ) Notice: Subject to any disclaimer, the term of this patent is extended or adjusted under 35 U.S.C. 154(b) by 353 days.

(21) Appl. No.: 17/308,636

(22) Filed: May 5, 2021

(65) Prior Publication Data

US 2021/0255218 A1     Aug. 19, 2021

Related U.S. Application Data

(63) Continuation-in-part of application No. PCT/EP2019/080171, filed on Nov. 5, 2019.

(30) Foreign Application Priority Data

Nov. 6, 2018 (IT) .......................... 102018000010071

(51) Int. Cl.
     *G01R 1/073*      (2006.01)
(52) U.S. Cl.
     CPC ................ *G01R 1/07342* (2013.01)
(58) Field of Classification Search
     CPC ............ G01R 1/07342; G01R 1/07371; G01R 1/07357; G01R 1/07314
     See application file for complete search history.

(56) References Cited

U.S. PATENT DOCUMENTS

| | | |
|---|---|---|
| 6,411,112 B1 | 6/2002 | Das et al. |
| 2002/0086562 A1 | 7/2002 | Uratsuji |
| 2012/0025859 A1 | 2/2012 | Huang et al. |

(Continued)

FOREIGN PATENT DOCUMENTS

| | | |
|---|---|---|
| CN | 107430150 A | 12/2017 |
| EP | 2107380 A1 | 10/2009 |

(Continued)

OTHER PUBLICATIONS

English Machine Translation of Sabatier FR 2860347 (Year: 2005).*
English Machine translation of Kimura JP-2007127488-A (Year: 2007).*

*Primary Examiner* — Jermele M Hollington
(74) *Attorney, Agent, or Firm* — Seed IP Law Group LLP

(57) ABSTRACT

A probe head for testing a device under test includes an upper guide and a lower guide parallel to each other and spaced apart. Each of the guides is provided with a respective plurality of guide holes, a plurality of contact probes housed in the guide holes and provided each with a first end and with a second end, the first end being adapted to contact pads of a device under test. At least one additional guide is associated with one of the guides. The additional guide includes first guide holes, housing a first group of the contact probes, and second guide holes, housing a second group of the contact probes. The first and second guide holes are shifted with respect to the guide holes of the guide which said additional guide is associated with, and the shift of the first guide holes is in a direction opposite the shift of the second guide holes.

6 Claims, 4 Drawing Sheets

(56) References Cited

U.S. PATENT DOCUMENTS

2017/0122984 A1\* 5/2017 Hsu .................... G01R 1/07314
2019/0377002 A1\* 12/2019 Lee .................... G01R 1/07314

FOREIGN PATENT DOCUMENTS

| FR | 2860347 A1 \* | 4/2005 | ......... G01R 1/07357 |
|----|---|---|---|
| JP | 2007127488 A \* | 5/2007 | |
| JP | 2009276097 A | 11/2009 | |
| JP | 2015-118064 A | 6/2015 | |
| WO | 2016/108520 A1 | 7/2016 | |
| WO | 2016156002 A1 | 10/2016 | |
| WO | 2016157964 A1 | 10/2016 | |

\* cited by examiner

VERTICAL PROBE HEAD WITH IMPROVED CONTACT PROPERTIES TOWARDS A DEVICE UNDER TEST

BACKGROUND

Technical Field

The present disclosure refers to a probe head comprising a plurality of vertical probes with an improved load distribution on a semiconductor wafer. More specifically, the present disclosure refers to a probe head comprising at least one upper guide and one lower guide provided with guide holes for housing a plurality of contact probes, and the following description is made with reference to this application field with the only purpose of simplifying the exposition thereof.

Description of the Related Art

As it is well known, a probe card is an electronic device adapted to electrically connect a plurality of contact pads of a microstructure, such as an integrated device, with corresponding channels of a testing apparatus that performs the functionality testing thereof, in particular electric, or generically the test.

The test, which is performed on integrated devices, is particularly useful for detecting and isolating defective circuits as early as in the production phase. Normally, probe cards are therefore used for the electric test of devices that are integrated on wafers before cutting and assembling them inside a chip containment package.

A probe head essentially comprises a plurality of movable contact elements or contact probes retained by at least one pair of supports or guides that are substantially plate-shaped and parallel to each other. Said guides are provided with suitable guide holes and are arranged at a certain distance from each other in order to leave a free area or air gap for the movement and possible deformation of the contact probes, which are slidingly housed in said guide holes. The pair of guides comprises in particular an upper guide and a lower guide, both provided with guide holes within which the contact probes axially slide, which are usually made of wires of special alloys with good electric and mechanical properties.

The proper connection between the contact probes and the contact pads of the device under test is ensured by the pressure of the probe head on the device itself, the contact probes undergoing, during said pressing contact, a bending inside the air gap between the guides and a sliding inside the respective guide holes. Probe heads of this type are commonly called as having vertical probes and are indicated with the English term "vertical probe heads".

Substantially, the vertical probe heads have an air gap in which a bending of the contact probes occurs, said bending can be helped by a suitable configuration of the probes themselves or of the guides thereof, as schematically illustrated in FIG. 1.

In particular, FIG. 1 schematically illustrates a probe head 1 comprising at least one plate-shaped support or upper guide 2, usually indicated as "upper die", and a plate-shaped support or lower guide 3, usually indicated as "lower die", having respectively guide holes 4 and 5 within which a plurality of contact probes 6 slides.

Each contact probe 6 ends at an end with a contact tip 7 intended to abut onto a contact pad 8 of a device under test integrated on a wafer 9, so as to realize the mechanical and electric contact between said device under test and a testing apparatus (not shown), which said probe head forms a terminal element of.

Herein and hereinafter the term "contact tip" indicates an end area or region of a contact probe intended to contact a contact pad, said end area or region being not necessarily pointed.

In some cases, the contact probes are fixedly fastened to the probe head itself at the upper plate-shaped support: such probe heads are referred to as "blocked probe heads".

However, more frequently, probe heads are used with not fixedly fastened blocked probes, but held interfaced to a so-called board, possibly through a microcontact board provided with a plurality of contact pads: such probe heads are referred to as "unblocked probe heads". The microcontact board is usually called "space transformer" since, besides contacting the probes, it also allows spatially redistributing the contact pads realized thereon with respect to the contact pads on the device under test, in particular relaxing the distance constraints between the centers of the pads themselves.

In this case, as illustrated in FIG. 1, each contact probe 6 has a further end area or region ending with a so-called contact head 7A towards a contact pad 8A of a plurality of contact pads of a space transformer 9A. The proper electric connection between probes 6 and space transformer 9A is ensured by the pressure abutment of the contact heads 7A of the contact probes 6 onto the contact pads 8A of the space transformer 9A analogously to the contact between the contact tips 7 with the contact pads 8 of the device under test integrated on the wafer 9.

As indicated in FIG. 1, the upper guide 2 and the lower guide 3 are suitably spaced apart by an air gap 10 which allows the contact probes 6 to deform. Finally, the guide holes 4 and 5 are dimensioned so as to allow the contact probe 6 to slide therein.

The correct operation of a probe head having vertical probes of the described type is basically linked to two parameters: the vertical movement, or overtravel, of the contact probes and the horizontal movement, or scrub, of the contact tips of said contact probes. It is notoriously important to ensure the scrub of the contact tips so as to allow superficially scratching the contact pads, in particular of the device under test, removing the impurities formed thereon, for instance in the form of a thin layer or film of oxide or other accumulated dirt, thus improving the contact performed by the probe head by means of its probes.

All these features should be evaluated and calibrated in the manufacturing step of a probe head, since the proper electric connection between probes and device under test should always be ensured.

According to a known methodology, the contact probes 6 are initially made straight, with a constant cross-section along their entire length, in case rectangular, and generally thinned and possibly pointed at the ends to form the contact ends, in particular the contact tip 7 and the contact head 7A respectively, as illustrated in FIG. 1. Successively, the probe head is made by overlapping the upper guide 2 and the lower guide 3 in order to match the respective guide holes, namely by aligning the respective centers according to a direction orthogonal to the guides, inserting the contact probes 6 into said guide holes, spacing the upper guide 2 from the lower guide 3 to form the air gap 10 and then shifting said guides, thus causing a deformation of the body of the contact probes 6, in a substantially central position, as illustrated in FIG. 1.

In this case the probe heads are referred to as probe heads with shifted plates and the contact probes 6 are also indicated as "buckling beam".

Furthermore, the relative shift of the upper guide 2 and lower guide 3 determines a deformation direction of the contact probe 6 and thus the movement direction of the respective contact tip 7 on the contact pad 8 of the device under test integrated on a wafer 9, which is indicated as scrub direction Dscrub in FIG. 1.

It is also possible to use already pre-deformed probes, the shift between the guides accentuating in this case said pre-deformation.

It is also known that for a probe head having vertical probes and shifted plates, such as the one illustrated in FIG. 1, when the contact tips 7 of the contact probes 6 contact the contact pads 8 of the device under test integrated on a wafer 9, the deformation of the probes 6 causes a bending that is substantially identical for all of the contact probes 6, so that each contact tip 7 exerts a scrub in the direction Dscrub on the contact pads 8, as indicated by the arrow in FIG. 1.

However, this simultaneous scrub mechanism of all of the contact tips 7 of the plurality of contact probes 6 contained in the probe head 1 generates a shear force on the wafer 9, which comprises the devices under test, namely a force acting in the direction Dscrub which is equal to the sum of the forces generated by all probes (all acting in the same direction Dscrub) on all contact pads 8, said shear force on the wafer 9 may thus reach high values. In particular, shear force indicates herein a force that is substantially parallel to the wafer 9, which defines a plane that is substantially parallel to the one in which the upper guide 2 and the lower guide 3 of the probe head 1 lie at a face thereof facing the probe head 1, which is the face on which the contact pads 8 are formed and onto which the contact tips 7 of the contact probes 6 abut.

Since the probe heads usually comprise thousands of probes, the shear force due to the scrub of all of the contact probes may be such as to cause a considerable lateral shift of the wafer 9 when the probe head presses thereon. This problem is also particularly felt in case of testing single dies.

For this reason, there is a need today to reduce this undesired lateral shift in order to improve the test performed by the probe head.

Therefore, it is desirable to provide a probe head for testing electronic devices having structural and functional features such as to allow overcoming the limitations and drawbacks still affecting the probe heads made according to the prior art, in particular able to reduce the shear force exerted on the wafer by own contact probes, in a simple and effective manner.

BRIEF SUMMARY

The present disclosure provides a probe head having vertical probes equipped with an upper guide and a lower guide, wherein a further guide is associated with at least one of said guides, said further guide being arranged in the space defined between said upper and lower guides in order to form a pair of parallel guides and whose guide holes are suitably shifted so as to determine an opposite deformation and scrub for two different groups of contact probes housed in said guide holes.

More in particular, an exemplary probe head for testing a device under test integrated on a semiconductor wafer comprises an upper guide and a lower guide parallel to each other and spaced apart, each of said guides being provided with a respective plurality of guide holes, a plurality of contact probes housed in the guide holes and provided each with a first end and with a second end, said first end being adapted to connect contact pads of a device under test, and at least one additional guide associated with one of said guides, said additional guide being substantially parallel to the upper guide and to the lower guide and being arranged therebetween, wherein the additional guide comprises first guide holes, housing a first group of the contact probes, and second guide holes, housing a second group of the contact probes, wherein the first and second guide holes are shifted with respect to the guide holes of the guide which the additional guide is associated with, and wherein the shift of the first holes is in a direction opposite the shift of the second guide holes, resulting in a scrub movement of the ends of the first group of the contact probes opposite that of the second group of the contact probes.

More particularly, the disclosure comprises the following additional and optional features, taken singularly or in combination if necessary.

According to an aspect of the present disclosure, the first guide holes may be grouped into at least one first area of the additional guide and the second guide holes may be grouped into at least one second area of said additional guide, wherein the ends of the contact probes of the first group in said first area have opposite scrub with respect to the ends of the contact probes of the second group in said second area, forming distinct areas of the probe head having opposite shear forces on the semiconductor wafer.

According to another aspect of the present disclosure, the probe head may comprise a first area including only all the first guide holes, and a second area including only all the second guide holes, only forming two distinct areas of the probe head having opposite shear forces on the semiconductor wafer.

Alternatively, the probe head may comprise a plurality of first areas and second areas arranged adjacent and alternated to each other, each of said areas including guide holes arranged in rows, forming a plurality of rows of the probe head with opposite shear forces on the semiconductor wafer.

According to another aspect of the present disclosure, the pitch of the guide holes of said upper guide may be substantially equal to the pitch of the guide holes of the lower guide, said guide holes being substantially concentric with each other.

According to another aspect of the present disclosure, the probe head may comprise a first additional guide, which is associated with the upper guide forming a pair of upper guides separated from each other by an upper gap, and a second additional guide, which is associated with the lower guide forming a pair of lower guides separated from each other by a lower gap, wherein the first guide holes of the first additional guide are shifted with respect to the guide holes of the upper guide in a direction opposite the shift of the second guide holes of said first additional guide, and wherein the first guide holes of the second additional guide are shifted with respect to the guide holes of the lower guide in a direction opposite the shift of the second guide holes of said second additional guide.

Alternatively, the additional guide may only be associated with the upper guide forming a pair of upper guides separated from each other by an upper gap. In this case, the lower guide may be associated with a second lower guide forming a pair of lower guides separated from each other by a lower gap, said lower guides having guide holes concentric to each other.

According to a further alternative aspect of the present disclosure, the additional guide may only be associated with the lower guide forming a pair of lower guides separated from each other by a lower gap. In this case, the upper guide may be associated with a second upper guide forming a pair of upper guides separated from each other by an upper gap, said upper guides having guide holes concentric to each other.

According to another aspect of the present disclosure, the contact probes may comprise a body extending according to a longitudinal axis between the first end and the second end.

Still according to another aspect of the present disclosure, the shift of the first and second guide holes may result in a specular deformation of the contact probes of the first group with respect to the contact probes of the second group.

Still according to another aspect of the present disclosure, the scrub of the contact probes of the first group and the scrub of the contact probes of the second group may occur inwards with respect to an outer edge of the guides of the probe head.

Finally, the shift of the first and second guide holes with respect to the guide holes of the upper guide may be substantially equal to 25-30 μm, preferably 30 μm, and the shift of the first and second guide holes with respect to the guide holes of the lower guide may be substantially equal to 5-15 μm, preferably 10 μm.

The present disclosure also refers to a probe card for a testing apparatus of electronic devices, comprising at least one probe head made as above indicated, a space transformer adapted to perform a spatial transformation of the distances between contact pads made on a face thereof facing said probe head and/or a printed circuit board adapted to interface said probe card with a test apparatus.

In particular, according to an aspect of the present disclosure, the pitch of the contact pads of the space transformer may be substantially constant.

The characteristics and advantages of the probe card according to the disclosure will be apparent from the description, made hereinafter, of an embodiment thereof, given by indicative and non-limiting example, with reference to the accompanying drawings.

DETAILED DESCRIPTION

Figure 1:
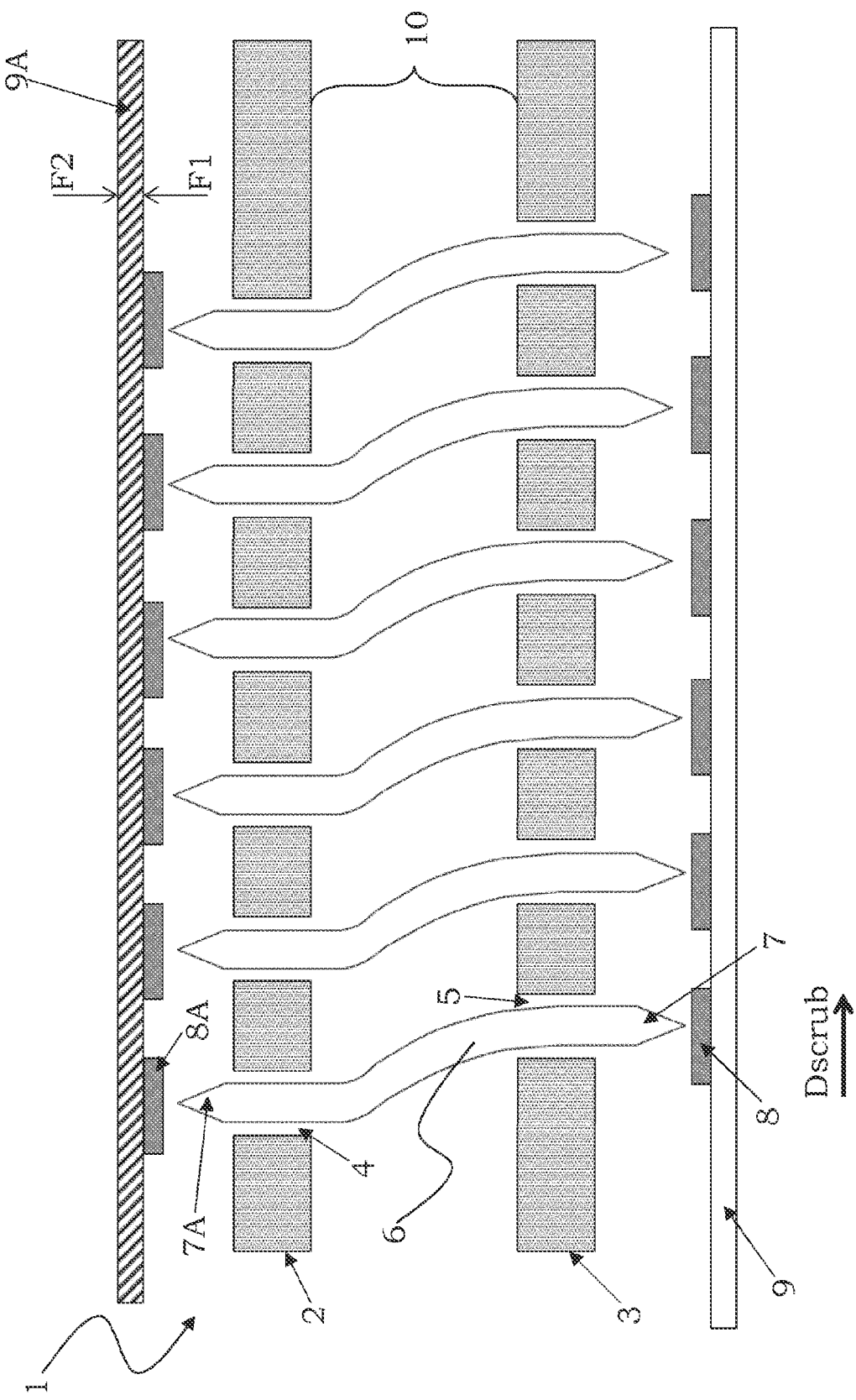
FIG. 1 schematically shows a probe head made according to the prior art.
Figure 2:
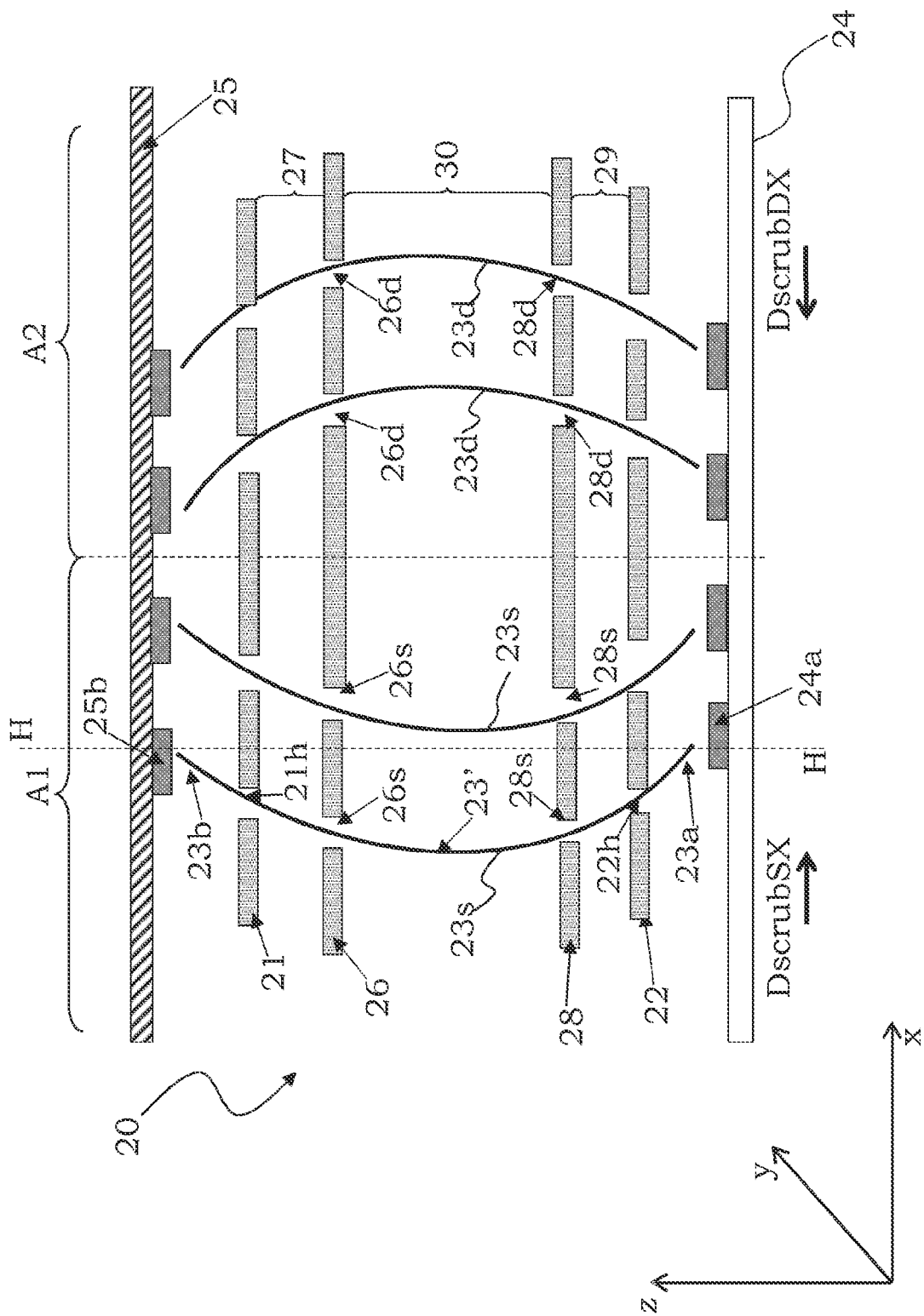
FIG. 2 schematically shows a probe head according to a preferred embodiment of the present disclosure.

With reference to said figures, and in particular to FIG. 2, reference number 20 globally and schematically indicates a probe head having vertical probes for testing electronic devices, in particular integrated on a semiconductor wafer, according to the present disclosure.

It should be noted that the figures represent schematic views and are not drawn to scale, but instead they are drawn so as to enhance the important features of the disclosure. Furthermore, in the figures, the different pieces are shown schematically, since their shape may vary according to the desired application. It should also be noted that in the figures identical reference numbers refer to elements identical in shape or function. Finally, particular expedients described in relation to an embodiment illustrated in a figure can also be used for the other embodiments illustrated in the other figures.

The probe head 20 comprises at least one upper guide 21 and one lower guide 22, which are parallel to and spaced apart from each other by a suitable air gap. The upper guide 21 and the lower guide 22 further comprise a respective plurality of guide holes indicated with reference numbers 21h and 22h, respectively.

The upper guide 21 and the lower guide 22 are substantially plate-shaped supports that are parallel to each other and may have any suitable shape (for instance rectangular or squared), in which the longitudinal development axes develop in a plane identified by axes x and y (horizontal axes) of the reference system of FIG. 2.

Furthermore, the probe head 20 comprises a plurality of contact probes intended to perform the electric and mechanical connection with contact pads of a device under test, said contact probes being slidingly housed in the guide holes 21h and 22h of the upper guide 21 and lower guide 22, respectively.

More particularly, as it will be illustrated in greater detail hereinafter, the probe head 20 suitably comprises a plurality of first contact probes 23s, arranged in a first portion of the probe head 20, in particular in the left portion according to the local reference of FIG. 2 and for this reason herein also indicated as left probes 23s, and a plurality of second contact probes 23d, arranged in a second distinct portion of the probe head 20, in particular in the right portion still according to the local reference of FIG. 2 and for this reason herein also indicated as right probes 23d.

For simplicity of illustration, in FIG. 2 only two left probes 23s and two right probes 23d are represented, said figure being only given by way of indicative and non-limiting example of the scope of the present disclosure, since the number of left probes 23s and right probes 23d may vary according to the requirements and circumstances. In a preferred embodiment, the number of left probes 23s is substantially identical to the number of right probes 23d.

Each contact probe 23s and 23d is initially made with a preferably rod-shaped body 23' which extends along a longitudinal axis H-H between a first end 23a and a second end 23b, said body being deformed as shown hereinafter. The first end 23a is intended to contact pads 24a of a device under test integrated on a semiconductor wafer 24 and is also indicated in the field as "contact tip", whereas the second end 23b is intended to contact pads 25b of a plate 25 associated with the probe head 20, such as for instance a space transformer or a printed circuit board (PCB), and is also indicated in the field as "contact head". It is noted that the ends 23a and 23b are not necessarily pointed, since their shape may vary according to the requirements and/or circumstances. It is further noted that the longitudinal axis H-H of the contact probes substantially develops in the direction indicated by axis z (vertical axis) of the reference system of FIG. 2.

The contact probes 23s and 23d are adapted to bend during the pressing contact with the pads 24a of the device under test and the present disclosure is inspired by the fact that the deformation direction of a contact probe during said pressing contact is determined by the shift between the guide holes of the probe head.

In this regard, the probe head 20 of the present disclosure also comprises at least one additional guide 26 associated with one of the guides 21 or 22 and arranged therebetween. The additional guide 26 as well is substantially a plate-shaped support that is parallel to the upper guide 21 and to the lower guide 22 and may have any shape analogous to the shape of said upper guide 21 and lower guide 22.

It is noted that, in the context of the present disclosure, the term "associated" indicates that the additional guide 26 is arranged close to a guide (upper or lower) and forms together with it a pair of guides (upper or lower) that are substantially parallel to each other. In other words, once an additional guide is associated with the upper or lower guide, a pair of upper or lower guides intended to house the contact probes is formed.

Advantageously according to the present disclosure, the additional guide 26 comprises first guide holes 26s housing a first group of the contact probes, in particular the left probes 23s, and second guide holes 26d housing a second group of the contact probes, in particular the right probes 23d, said first and second guide holes 26s and 26d having a relative position suitably designed to solve the problem of the shear force exerted on the wafer 24 by the contact probes.

In particular, the first guide holes 26s and the second guide holes 26d are shifted with respect to the guide holes of the guide which the additional guide 26 is associated with, i.e., with respect to the guide with which said additional guide 26 forms the pair of parallel supports.

FIG. 2 shows a preferred embodiment in which the additional guide 26 is associated with the upper guide 21 in order to form a pair of upper guides (said additional guide being hereinafter indicated as first additional guide 26), and in which a second additional guide 28 associated with the lower guide 22 and also provided with first guide holes 28s and with second guide holes 28d is also present, even if, as it will be illustrated hereinafter in greater detail, this configuration must not be intended as limiting of the scope of the present disclosure and other configurations are also comprised in the scope of protection defined by the claims.

What has been illustrated for the first additional guide 26 is also valid for the second additional guide 28. Consequently, in the example of FIG. 2, the first guide holes 26s and the second guide holes 26d are thus shifted with respect to the guide holes 21h of the upper guide 21, as well as the first guide holes 28s and the second guide holes 28d of the second additional guide 28 are shifted with respect to the guide holes 22h of the lower guide 22.

Still more particularly, suitably according to the present disclosure, the shift of the first guide holes 26s and 28s with respect to the holes of the upper and lower guides is in a direction opposite the shift of the second guide holes 26d and 28d, i.e., in a same line and opposite verso, thus obtaining an opposite scrub movement for the left probes 23s and for the right probes 23d.

The first guide holes 26s and the second guide holes 26d of the first additional guide 26 are thus shifted along a longitudinal axis of said additional guide 26, substantially orthogonal to the longitudinal axis of the probes and parallel for instance to axis x (horizontal axis) of the reference system of FIG. 2, with respect to the guide holes 21h of the upper guide 21 (and in general with respect to the holes of the guide which said first additional guide 26 is associated with), said longitudinal axis being substantially orthogonal to the guides 21, 22 and 26. The same identical reasoning is also applied to the guide holes of the second additional guide 28, in which the first guide holes 28s and the second guide holes 28d are shifted along a longitudinal axis of said second additional guide 28, substantially orthogonal to axis H-H and parallel for instance to axis x (horizontal axis) of the reference system of FIG. 2, with respect to the guide holes 22h of the lower guide 22.

The shift of the first and second guide holes 26s and 26d with respect to the upper guide holes 21h and of the second guide holes 28s and 28d with respect to the lower guide holes 22h is thus adapted to realize a deformation of the body 23' of the left probes 23s and of the right probes 23d; in particular, the opposite shift of said guide holes 26s and 26d, 28s and 28d, determines a deformation of the left probes 23s that is specular with respect to the deformation of the right probes 23d, said deformation determining the scrub direction of the relative contact tips.

In other words, the left probes 23s are housed in the first guide holes 26s and 28s of the additional guides 26 and 28 (and obviously also in the corresponding guide holes of the upper guide 21 and lower guide 22), whereas the right probes 23d are housed in the second guide holes 26d and 28d of said additional guides 26 and 28, thus determining the above specular deformation of said left probes 23s and right probes 23d.

It is noted that, in the context of the present disclosure, the term "specular deformation" indicates an opposite deformation of the left probes 23s with respect to the right probes 23d, in particular opposite with reference to the longitudinal axis H-H of the probes themselves.

According to the local reference of FIG. 2, the first guide holes 26s are moved to the left with respect to the upper guide holes 21h, whereas the second guide holes 26d are moved to the right, still according to the local reference of FIG. 2, with respect to the upper guide holes 21h. Namely, both the first guide holes 26s and the second guide holes 26d are moved towards the outside of the probe head 20 (i.e., towards an outer edge E), but in an opposite direction. The same shift direction is also in the first and second guide holes 28s and 28d with respect to the guide holes 22h of the lower guide 22.

The shift direction of the first and second guide holes 26s and 26d, 28s and 28d with respect to upper and lower guide holes thus determines the deformation of the contact probes and therefore the horizontal movement direction or scrub of the relative contact tips 23a on the contact pads 24a of the device under test, said scrub occurring in a direction parallel to the device under test and to the wafer 24 comprising it (i.e., according to axis x of the reference system of FIG. 2). Obviously, between each contact probe and each guide hole a clearance is also defined, whose amplitude is determined by the dimensions of the guide holes with respect to a diameter of the probes, which is meant, herein and below, as the maximum transversal dimension, also in the case of probes with non-circular section, said clearance allowing the horizontal movement of the probes.

In this way, thanks to the specular deformation of the left probes 23s and of the right probes 23d, the scrub of said probes is opposite, thus resulting in an opposite shear force (transversal) exerted by said probes. The shear forces of the left probes 23s and of the right probes 23d thus suitably cancel each other, solving the problem of the undesired movement of the device under test, the direction of said forces being determined by the deformation of the body 23' of the contact probes of the probe head 20.

Suitably, the first guide holes 26s and 28s are grouped in a first area A1 of the respective additional guides 26 and 28, whereas the second guide holes 26d and 28d are grouped in a second area A2 of said respective additional guides 26 e 28, said areas being thus areas with respective opposite scrubs for the contact tips 23a of the contact probes therein housed. In particular, the left probes 23s in the first area A1 have opposite scrubs with respect to the right probes 23d in the second area A2, thus forming two distinct areas of the probe head 20 with opposite shear forces on the semiconductor wafer 24. In other words, the presence of the first area A1 and of the second area A2 in which the holes of the first additional guide 26 and of the second additional guide 28 are grouped translates into a corresponding first area and second area of all the remaining guides and thus in general of the probe head 20, as above indicated.

Preferably, the first guide holes 26s and 28s in the first area A1 of the first additional guide 26 and of the second additional guide 28 are all consecutive to each other, as well as the second guide holes 26d and 28d in the second area A2 of the first additional guide 26 and of the second additional guide 28 are all consecutive to each other. The first area A1 thus only comprises the first guide holes 26s e 28s and the second area A2 only comprises the second guide holes 26d and 28d. In this way, an area of the probe head only comprising left probes 23s and another area of the probe head only comprising right probes 23d are identified.

As for the left probes 23s, the horizontal movement direction of the contact tips 23a on the contact pads 24a of the device under test is indicated as left scrub direction DscrubSX in FIG. 2, said scrub thus occurring in the same direction as of axis x of FIG. 2. Instead, as for the right probes 23d, the horizontal movement direction of the contact tips 23a on the contact pads 24a of the device under test is indicated as right scrub direction DscrubDX in FIG. 2, said right scrub direction DscrubDX being opposite the left scrub direction DscrubSX and thus the scrub of the right probes 23d occurs in the direction opposite axis x of FIG. 2. The first end or contact tip 23a (and the second end as well) of the left probes 23s has thus a left scrub direction DscrubSX opposite the right scrub direction DscrubDX of the first end 23a of the right probes 23d. In other words, with respect to the reference system of FIG. 2, specifically with respect to axis x, the left scrub direction DscrubSX is opposite the right scrub direction DscrubDX, in particular the left scrub direction DscrubSX is in the positive direction of axis x, whereas the right scrub direction DscrubDX is in the negative direction of axis x.

As previously indicated, this configuration of the contact probes of the probe head 20 has the great advantage that, since the left scrub direction DscrubSX of the left probes 23s is opposite the right scrub direction DscrubDX of the right probes 23d, the transversal or shear forces exerted by the left probes 23s on the device under test and thus on the semiconductor wafer 24 comprising it are substantially compensated by the shear forces exerted by the right probes 23d. The resultant of forces in the axis x direction of FIG. 2, i.e., the resultant of the shear forces parallel to a face of the semiconductor wafer 24 facing the probe head 20, exerted by the contact probes of the probe head 20, is thus substantially null, thus resulting in a compensated load on said semiconductor wafer 24.

Suitably, the above indicated advantage of the probe head 20 according to the present disclosure is obtained, along with the possibility of not modifying the pitch of the guide holes of the upper guide 21 and lower guide 22, whereas just the alignment of the guide holes of the first additional guide 26 and of the second additional guide 28 is modified.

Figure 3:
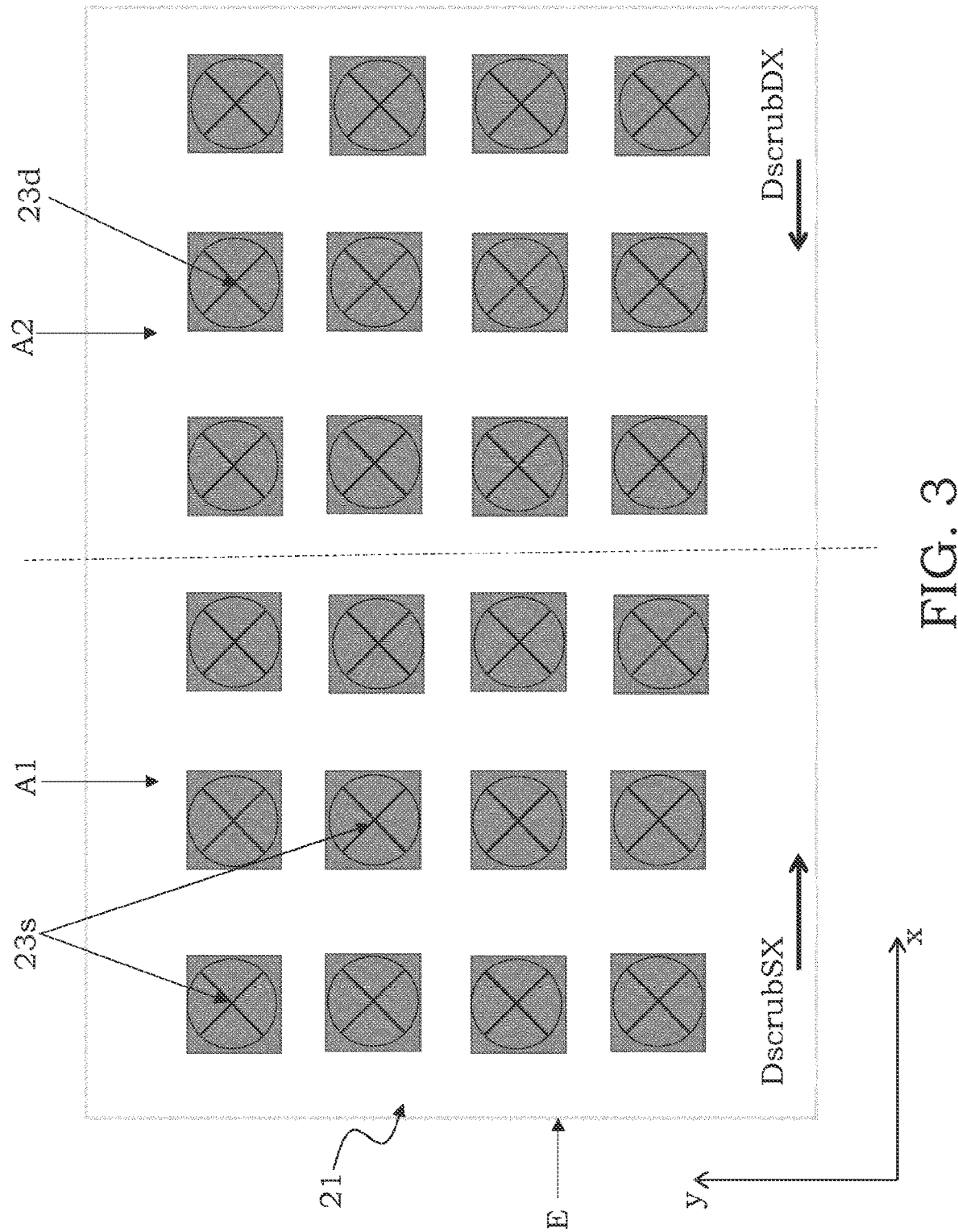
FIG. 3 schematically shows a view from above of a guide of the probe head according to the preferred embodiment of the present disclosure.

FIG. 3 shows a view from above of a guide of the probe head 20, in particular the upper guide 21, according to a preferred embodiment in which there is only a first area A1, in which the left probes 23s have a scrub direction DscrubSX and only a second area A2, in which the right probes 23d have a scrub direction DscrubDX. Obviously, the same FIG. may also be replicated for all the other guides of the probe head 20. Furthermore, as indicated in FIG. 3, the scrub DscrubSX of the left probes 23s and the scrub DscrubDX of the right probes 23d is opposite and faces inwards with respect to the outer edge E of the guides of the probe head 20.

Therefore, in this preferred embodiment there are a first area A1 and a second area A2, each one occupying half probe head 20.

Figure 4:
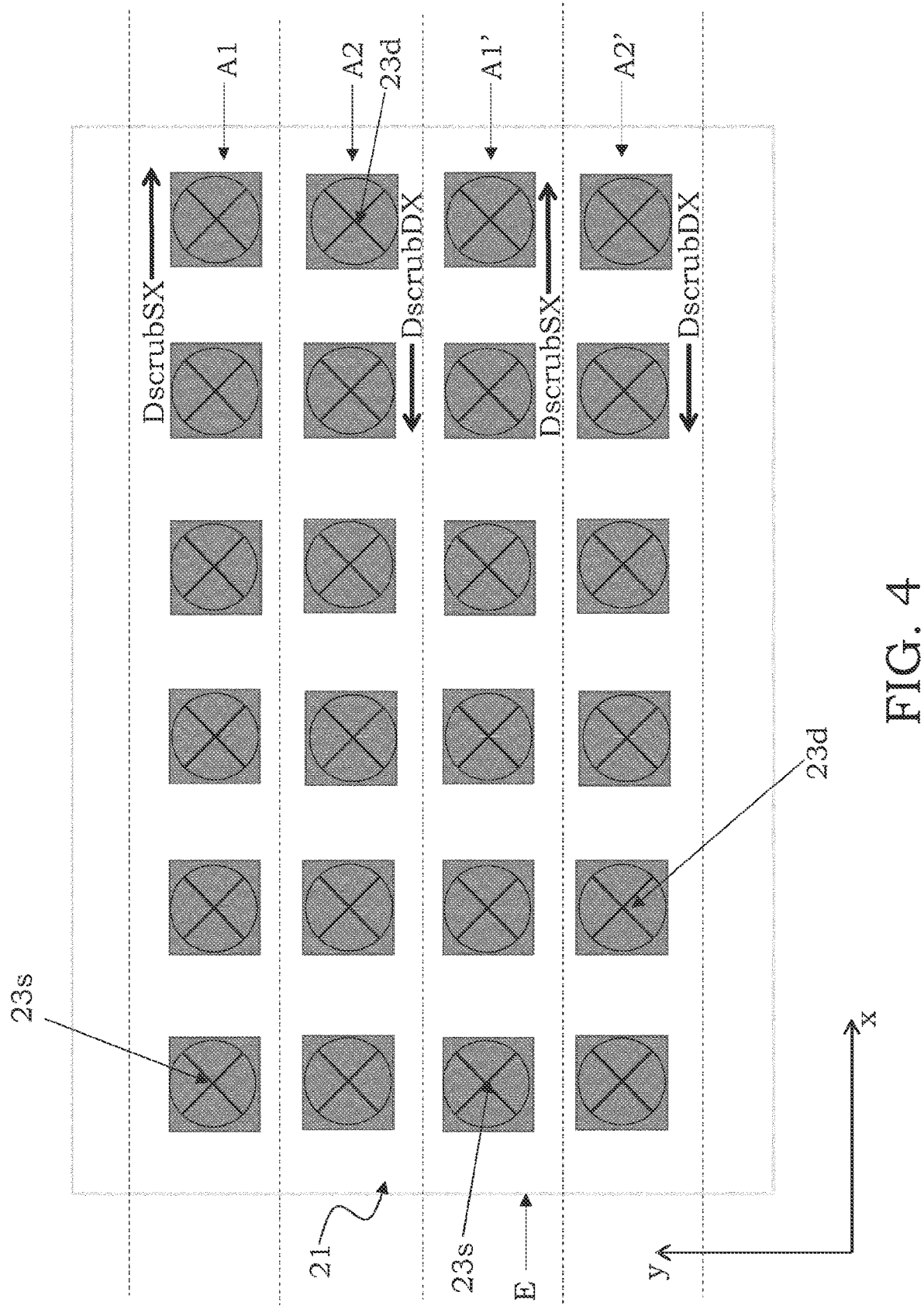
FIG. 4 schematically shows a view from above of a guide of the probe head according to an alternative embodiment of the present disclosure.

Obviously, the embodiment of FIG. 3, although it is to be considered as preferred, is not to be intended as limiting of the scope of the present disclosure and other embodiments are also possible. For instance, the left probes 23s and right probes 23d may be organized in consecutive rows, in which in a row the left probes 23s are arranged and in the adjacent rows the right probes 23d are arranged, said rows of left probes 23s and right probes 23d alternating with each other as illustrated in FIG. 4. In this case, not only are there two areas characterized by opposite scrubs, but a plurality of consecutive areas. In other words, in the embodiment of FIG. 4 there is a plurality of first areas (for simplicity only two first areas A1 and A1' are indicated) and of second areas (for simplicity only two second areas A2 and A2' are indicated), arranged alternately, each of said areas including guide holes arranged in rows, forming a plurality of rows of the probe head 20 with opposite shear forces on the semiconductor wafer 24.

In any case, the subdivision of the probe head 20 exactly into two areas A1 and A2 is preferable since in this way, in addition to canceling the opposite scrubs, any momentum exercised on the wafer 24 is canceled, just as the possibility of an undesired contact between very close contact probes is greatly reduced.

Still with reference to FIG. 2, as previously indicated, the probe head 20 is of the type having non-fastened vertical probes and the contact head 23b of the contact probes is adapted to abut onto contact pads 25b of a plate 25, in particular an interposer or space transformer.

In particular, the space transformer 25 is adapted to perform a spatial transformation of the distances between the centers or pitches of the contact pads formed on opposite faces. In particular, on a first face of the space transformer 25 facing the probe head 20, the contact pads 25b may have between each other a pitch equal to that of the contact pads 24a of the device under test, whereas the contact pads (not illustrated) formed on a second and opposite face of the space transformer 25 have a pitch equal to that of contact pads formed on a printed circuit board or PCB (also not illustrated), which the space transformer 25 generally connects to, in particular they have a pitch greater than the pitch of the contact pads 25b, performing in this way the desired spatial transformation and allowing a simpler arrangement of the contact pads on said second and opposite face and a simpler connection with the PCB and thus with the testing apparatus.

In this regard, in addition to what has been illustrated above, a further advantage of the described configuration is due to the fact that the probe head 20 of the present disclosure provides for the shift just of the holes of the additional guides 26 e 28, which are arranged between the upper guide 21 and the lower guide 22. This allows not modifying the pitch of the guide holes of the upper guide 21 and of the lower guide 22 (which can therefore remain constant) and thus it is not necessary to design dedicated layouts (and often complicated) for the contact pads 25b of the space transformer 25; this further allows associating the probe head 20 in a very simple manner with pre-existing space transformers as well, thanks to the simple and effective subdivision of the contact probes layout simply obtained by modifying the shift of the holes of the additional guide 26 and of the additional guide 28. In other words, the solution of present disclosure advantageously allows maintaining the invariance of the contact pads 25b of the space transformer 25.

Suitably, the pitch of the guide holes 21h of the upper guide 21 is substantially identical to the pitch of the guide holes 22h of the lower guide 22, said guide holes 21h, 22h being in this way substantially concentric to each other (and thus substantially aligned to each other). It is thus clear that, as above illustrated, the solution of the present disclosure allows maintaining the invariance of the contact pads of the device under test and of the space transformer, also thanks to the possibility of maintaining a substantial alignment of the ends 23a and 23b of the probes. This alignment of the ends is illustrated in FIG. 2 and is due to the particular advantageous configuration of the probe head 20 of the present disclosure.

Furthermore, as above indicated, FIG. 2 illustrates the preferred embodiment in which there is the first additional guide 26 associated with the upper guide 21, forming in this way a pair of upper guides separated from each other by an upper gap 27, and in which the second additional guide 28 associated with the lower guide 22 is also present, in order to form a pair of lower guides separated from each other by a lower gap 29. The second additional guide 28 is arranged between the upper guide 21 and lower guide 22, in particular between the first additional guide 26 and the lower guide 22, so that three gaps are defined: the gap 27 between the upper guide 21 and the additional guide 26, the gap 29 between the lower guide 22 and the second additional guide 28 and a gap 30 (generally of greater extension) between the first additional guide 26 and the second additional guide 28. In other words, in the preferred embodiment of FIG. 2 there are a first additional guide 26 and a second additional guide 28 with oppositely shifted holes, said additional guides being associated with the upper guide 21 and the lower guide 22, respectively.

This configuration is preferred since it is the one that allows obtaining the desired effect in a simpler manner, assuring a greater control on the deformation of the probes and thus on the scrub of the respective contact tips. In this case, the contact probes are initially preferably made straight, with the body 23' extending along the longitudinal axis H-H, and the advantageous deformation of the probes is obtained through the shift of the guide holes of the first additional guide 26 and of the second additional guide 28.

However, it is noted that this embodiment is not to be considered as limiting of the scope of the present disclosure and other embodiments are possible.

By way of example, it is possible to provide an embodiment in which only the additional guide 26 is present, and the lower guide 22 is possibly associated with a traditional guide having concentric guide holes, thus forming a traditional pair of lower guides having guide holes concentric to each other.

Alternatively, it is possible to provide another embodiment in which only the second additional guide 28 is present, and also in this case the upper guide 21 may be associated with a traditional guide having concentric guide holes, thus forming a traditional pair of upper guides having guide holes concentric to each other.

In these alternative embodiments, the use of pre-deformed probes is further possible, in order to force even more the scrub movement.

Furthermore, the shift of the first guide holes 26s and second guide holes 26d of the first additional guide 26 with respect to the holes of the upper guide 21 is substantially equal to 30 µm (in general comprised between 25 µm and 35 µm), whereas in the case of the second additional guide 28 the shift with respect to the holes of the lower guide 22 is substantially equal to 10 µm (in general comprised between 5 µm and 15 µm). These values allow maintaining a substantial alignment between tips 23a and heads 23b of the contact probes, meanwhile assuring an easy assembly of the probe head 20.

The present disclosure also refers to a probe card for a testing apparatus of electronic devices comprising the probe head 20 and the space transformer 25 adapted to perform a spatial transformation of the distances between the contact pads 25b formed on the face thereof facing the probe head 20, and/or a printed circuit board PCB adapted to interface the probe card with the testing apparatus.

In conclusion, the present disclosure provides a probe head having vertical probes provided with an upper guide and lower guide, in which at least one further guide is associated with one of said guides, said further guide being arranged in the space defined between said upper and lower guides in order to form a pair of parallel guides and in which guide holes are suitably shifted so as to determine opposite deformation and scrub for two different groups of contact probes housed in said guide holes.

Advantageously, the left probes have a scrub movement that is opposite the scrub movement of the right probes since said probes have a specular deformation due to the shift of the holes. Consequently, the transversal or shear total load exerted by said contact probes on a device under test and on the semiconductor wafer comprising it is substantially compensated, i.e., the resultant of the forces, exerted by the probe head, parallel to a face of the device under test facing the probe head is thus substantially null. This allows a more precise test and avoids phenomena such as the lateral movement of the semiconductor wafer due to the not compensated lateral forces (shear forces) of the contact probes.

Furthermore, the elimination of the lateral forces is achieved without renouncing the scrub movement of the single contact tips of the probes, said movement allowing for instance to remove impurities from the pads of the device under test, only the resultant of the lateral forces being canceled thanks to the configuration disclosed in the present disclosure.

Suitably, the illustrated particular structure provides modifying the shift of only the holes of the additional guides arranged between the upper and lower guides, allowing a great freedom in the choice of the layout; the pitch of the space transformer is replicated by the holes of the upper guide, whereas there is the freedom of modifying the pitch between the guide holes of the additional guide according to the requirements. In this way, the invariance of the space transformer is maintained.

Finally, it is noted that, thanks to the adopted configuration, undesired contacts between nearby probes are avoided.

It is thus clear that the described probe head solves the problems of the prior art, allowing an improved test, especially in case of numerous contact probes.

From the foregoing it will be appreciated that, although specific embodiments of the disclosure have been described herein for purposes of illustration, various modifications may be made without deviating from the spirit and scope of the disclosure, all included in the protection scope as defined by the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe head for testing a device under test integrated on a semiconductor wafer, comprising:
    an upper guide and a lower guide parallel to each other and spaced apart, each of said guides being provided with a respective plurality of guide holes;
    a plurality of contact probes housed in the guide holes and provided with a first end and a second end, the first end being adapted to contact pads of a device under test; and
    at least one additional guide associated with one of the guides, the additional guide being substantially parallel to the upper guide and to the lower guide and being arranged therebetween,
    wherein the additional guide comprises first guide holes, housing a first group of the contact probes, and second guide holes, housing a second group of the contact probes,
    wherein the first and second guide holes are shifted with respect to the guide holes of the guide which the additional guide is associated with, and wherein the shift of the first guide holes is in a direction opposite the shift of the second guide holes, resulting in a scrub movement of the ends of the first group of the contact probes opposite that of the second group of the contact probes,
    wherein the first guide holes are grouped into a first area of the additional guide, and the second guide holes are grouped into a second area of the additional guide, wherein the ends of the contact probes of the first group in the first area have scrubs opposite the ends of the contact probes of the second group in the second area, forming distinct areas of the probe head having opposite transversal forces on the semiconductor wafer,
    wherein the first area is an area of the probe head comprising only the first guide holes and the second area is an area of the probe head comprising only the second guide holes, and
    wherein the first area only includes all first guide holes, and the second area only includes all second guide holes, forming only two distinct areas of the probe head having opposite transversal forces on the semiconductor wafer, and
    wherein the at least one additional guide comprises a first additional guide and a second additional guide, the first additional guide being associated with the upper guide forming a pair of upper guides separated from each other by an upper gap, and the second additional guide being associated with the lower guide forming a pair of lower guides separated from each other by a lower gap, wherein the first guide holes of the first additional guide are shifted with respect to the guide holes of the upper guide in a direction opposite the shift of the second guide holes of the first additional guide, and wherein the first guide holes of the second additional guide are shifted with respect to the guide holes of the lower guide in a direction opposite the shift of the second guide holes of the second additional guide.

2. The probe head according to claim 1, wherein the pitch of the guide holes of the upper guide is substantially equal to the pitch of the guide holes of the lower guide, the guide holes being substantially concentric with each other so that the first end and the second end of each respective contact probe are substantially aligned with each other.

3. The probe head according to claim 1, wherein the shift of the first and second guide holes results in a specular deformation of the contact probes of the first group with respect to the contact probes of the second group.

4. The probe head according to claim 1, wherein the scrub of the contact probes of the first group and the scrub of the contact probes of the second group occurs inwards with respect to an outer edge of the guides of the probe head.

5. A probe card for a test equipment of electronic devices, comprising at least one probe head according to claim 1, and a printed circuit board adapted to interface the probe card with a test equipment.

6. The probe card according to claim 5, comprising a space transformer adapted to perform a spatial transformation of the distances between contact pads made on a face thereof facing the probe head, wherein the pitch of the contact pads of the space transformer is substantially constant.

* * * * *